MONOSTABLE MULTIVIBRATOR IN A SINGLE CRYSTALLINE WAFER

Filed Feb. 13, 1962 3 Sheets-Sheet 1

INVENTORS.
JOHN PHILIPS,
WALTER ZIFFER.
BY
C. L. Menzemer
ATTORNEY

MONOSTABLE MULTIVIBRATOR IN A SINGLE CRYSTALLINE WAFER

Filed Feb. 13, 1962 3 Sheets-Sheet 2

INVENTORS.
JOHN PHILIPS,
WALTER ZIFFER
BY
C. L. Menzemer
ATTORNEY

MONOSTABLE MULTIVIBRATOR IN A SINGLE CRYSTALLINE WAFER

Filed Feb. 13, 1962 3 Sheets-Sheet 3

INVENTORS.
JOHN PHILIPS,
WALTER ZIFFER.
BY
C. L. Menzemer
ATTORNEY 3,218,469

MONOSTABLE MULTIVIBRATOR IN A SINGLE CRYSTALLINE WAFER

John Philips, Pittsburgh, Pa., and Walter Ziffer, Fairfield, Conn., assignors to Westinghouse Electric Corporation, East Pittsburgh, Pa., a corporation of Pennsylvania Filed Feb. 13, 1962, Ser. No. 172,950
3 Claims. (Cl. 307—88.5)

This invention relates to a semiconductor device and more particularly it relates to a monolithic semiconductor device that functions as a monostable multivibrator contained in a unitary body of a semiconductor material.

In many kinds of electronic instruments and systems, monostable multivibrators are used, sometimes in substantial numbers. Such devices have been provided heretofore by appropriately interconnected vacuum tubes and associated circuitry, and more recently by using transistors in the prior circuits with suitable modification. Such devices were improved with the substitution of transistors for vacuum tubes and the use of printed circuits, because transistors are smaller and more rugged than vacuum tubes, require no filament power, operate at a low supply voltage, dissipate relatively little power, and ordinarily have a service life that exceeds that of heated filament vacuum tubes, while printed circuits are more easily prepared and assembled. With large usage of monostable multivibrators, the advantages attending transistor substitution for vacuum tubes and the use of printed circuits are multiplied. However, even transistor-containing devices are complex and bulky in the aggregate, and subject to material failure in consequence of the many parts and connections that are involved.

It is therefore the primary object of the present invention to provide a monostable multivibrator comprising cooperating portions made up of p-n junctions, resistance regions and capacitance regions all within a unitary or monolithic body of semiconductor material, the recited portions being electrically interconnected primarily through a part of the resulting monolithic device.

Other objects of the invention will be apparent from the following detailed description.

The invention will be readily understood upon considering its detailed description in conjunction with the drawings, in which.

In accordance with the present invention, the objects are attained by providing a monolithic semiconductor device comprising, within a unitary body of a semiconductor material, a pair of common emitter transistors coupled through a time delay comprising a resistance and capacitance so that, upon application of an input and cut-off bias D.-C. voltage, one transistor conducts while the other does not. Upon application of a turn-off pulse to the conducting transistor, its conduction decays to a low value and is retained there for a period determined by the characteristics of the time delay means, during which time the other or second transistor conducts. At the end of the period, the transistors automatically switch to the first indicated stable state.

Figure 1:
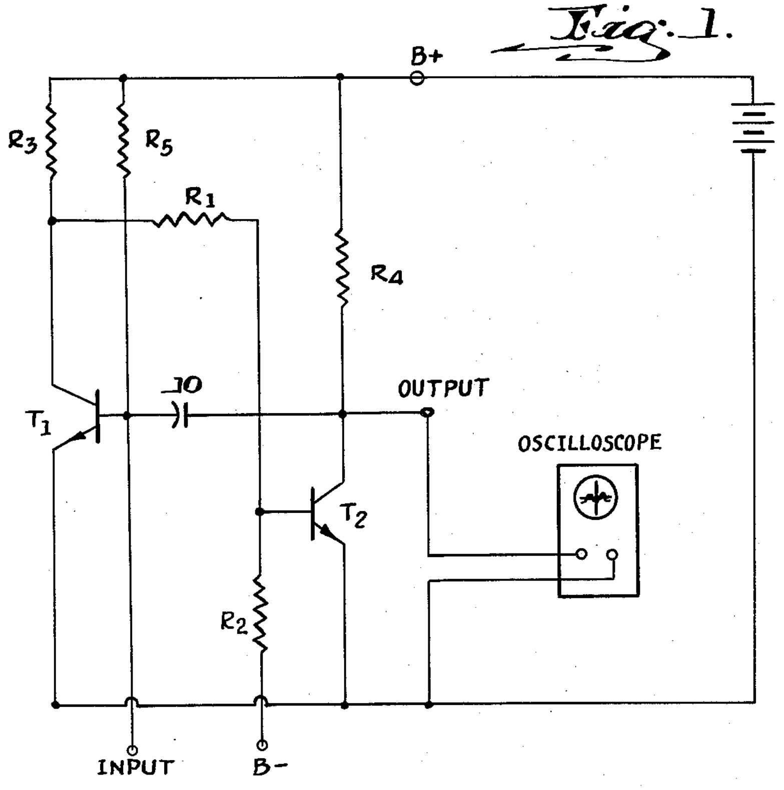
FIG. 1 is a schematic view of a transistorized monostable multivibrator circuit.

The monolithic monostable multivibrator comprising the invention provides the same function as the component transistorized circuit shown in FIG. 1, but with the advantages of smaller size and greater inherent reliability in consequence of the monolithic construction and minimized connections. Referring to FIG. 1, when a voltage is introduced at B+ and a cut-off D.-C. bias voltage is applied to transistor $T_2$, transistor $T_1$ will conduct while transistor $T_2$ will not. Upon the application of an input turn-off pulse, the conduction of transistor $T_1$ will decay to a low value as the capacitor 10 charges to a maximum. At this point, transistor $T_2$ will conduct for a period determined by the time constant of the resistance-capacitance circuit of $R_5C$ which controls $T_1$ by retaining it non-conducting until the charge on the capacitor 10 decays through resistance $R_5$. At the termination of that decay, the cut-off D.C. bias voltage is again effective to stop conduction in $T_2$ while the B+ voltage is returned to its initial state as to transistor $T_1$ and the latter again conducts. In essence, a single pulse initiates a prescribed series of events, the time and magnitude characteristics of which are determined by the characteristics of the transistors, the capacitor and the resistors, and there results an output waveform with a predetermined time delay. In accordance with the presence invention, this entire function is provided in a unitary monolithic body of semiconductor material.

For the purpose of clarity, the present invention will be described specifically in terms of preparing a monostable multivibrator in a semiconductor silicon body. It will be understood, however, that in addition to silicon other semiconductor materials may be used, for example, germanium, silicon carbide, or a semiconducting compound comprised, for example, of stoichiometric proportions of elements from Group III of the Periodic Table, for example gallium, aluminum and indium, and elements from Group V, for example, arsenic, phosphorus and antimony. Examples of suitable III-V stoichiometric compounds include gallium arsenide, indium antimonide and like compounds. It will also be understood that the silicon or other semiconductive material may be processed so that the semiconductivity of the various regions may be reversed in preparing devices of the invention from that hereinafter specifically indicated for purposes of illustration.

Figure 2:
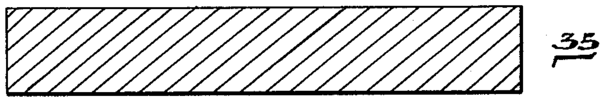
FIGS. 2 and 3 are side views in cross section of a wafer of a semiconductor material being processed in accordance with the teachings of this invention.

Referring to FIG. 2, there is illustrated a single crystal silicon wafer 35 of n-type semiconductivity. The wafer 35 may be prepared by any of the many methods available in the art. By way of example, a single crystal silicon rod may be pulled from a melt comprised of silicon and at least one element from Group V of the Periodic Table, for example, arsenic, antimony or phosphorus. A wafer can be cut from the rod with, for example, a diamond saw; its surfaces may be smoothed by lapping, etching, or the like, if desired. A section of a dendritic crystal prepared in accordance with United States patent application Serial Number 844,288, filed October 5, 1959, now Patent 3,031,403, issued April 24, 1962, may also be used as the semiconductor material. The silicon wafer 35 can have a resistivity of about 5 ohm-cm. to 50 ohm-cm., and suitably about 20 to 30 ohm-cm., depending on the desired electrical characteristics. However, its resistivity can vary from the foregoing by a factor of 10 or more, depending largely on the manner of fabrication used and the values required for the resistances, capacitances and the like in the completed structure.

The wafer 35 is disposed in a diffusion furnace. The hottest zone of the furnace is at a temperature within the range of about 1100° C. to 1250° C. and has an atmosphere of the vapor of an acceptor doping material, for example, indium, gallium, aluminum or boron. The zone of the furnace within which a crucible of the acceptor impurity is located may be at a temperature of from 600° C. to 1250° C., the specific temperature being chosen to ensure the desired vapor pressure and surface concentration of diffusant from the crucible. The acceptor impurity diffuses into the surface of the n-type wafer. Since the acceptor impurity will normally diffuse through all sides of the wafer it may be necessary first to mask the surfaces through which no diffusion should occur. Alternatively, where diffusion has occurred through all surfaces, the diffused layers can be removed by abrasion, etching, or the like, where such diffusion is undesired.

Figure 3:
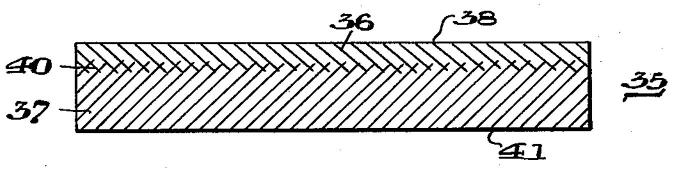

After diffusion through all surfaces and removal of the unneeded lower layer, wafer 35 has a p-type region 36 along its top surface leaving a diminished n-region 37, as shown in FIG. 3. The p-type region extending from the top surface 38 of the wafer 35 forms a first p-n junction 40 in the wafer with the top surface of the n-region 37.

The depth or thickness of the p-type region 36 produced in the semiconductor wafer 35 is dependent primarily upon the desired design characteristics of the resulting device and the manner of application of contacts. In addition, it must be deep enough to permit the alloying or fusion of contacts therewith without penetration through p-type region 36 to the n-type region 37 if those techniques are used. A depth of about 0.8 mil inwardly from the top surface 38 has been found to be satisfactory in a wafer having a total thickness of about 3 to 10 mils and a resistivity of 20 to 30 ohm-cm. These values are not critical. For example, when contacts are applied by evaporation techniques, a thickness of 0.1 mil may be satisfactory for the p-type layer 36.

Figure 4:
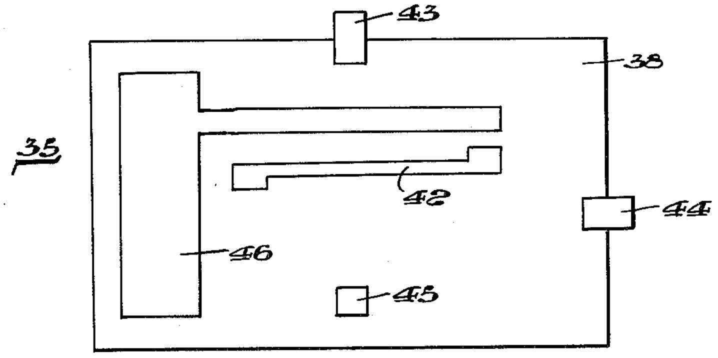
FIG. 4 is a top view of a wafer of semiconductor material showing the location of foil contacts.

Referring now to FIG. 4, an emitter portion 42 of n-type semiconductivity and ohmic contacts 43, 44, 45 and 46 of p-type conductivity are formed on the top surface 38 of the wafer 35 by disposing the respective materials, preferably in the form of shaped foils, upon the top surface 38 and alloying or fusing the foils thereto by heating in a vacuum of at least $10^{-2}$ mm. Hg, and preferably $10^{-5}$ mm. Hg, at a temperature of about 400° to 700° C. The emitter portion 42 may be formed, for example, from a foil comprised of at least one suitable n-type material, for example, antimony, arsenic, and phosphorus; and a neutral metal, such as gold. Typical emitter alloys include an alloy comprised of 99.0 to 99.5 percent gold and 0.5 to 1 percent antimony. The ohmic contacts 43, 44, 45 and 46 may be formed from, for example, a shaped foil comprised of at least one suitable p-type material, for example, boron, aluminum, gallium or indium and a neutral metal, for example gold. Examples of suitable alloys incude an alloy of 0.1 percent of boron and the remainder gold. A suitable thickness of the foils used to form emitter 42 and ohmic contacts 43, 44, 45 and 46 can be determined from a component phase diagram and the thickness of the p-zone 36. For present purposes, foils of about 0.75 to 1.25 mils and preferably 1 mil are satisfactory.

Figure 5:
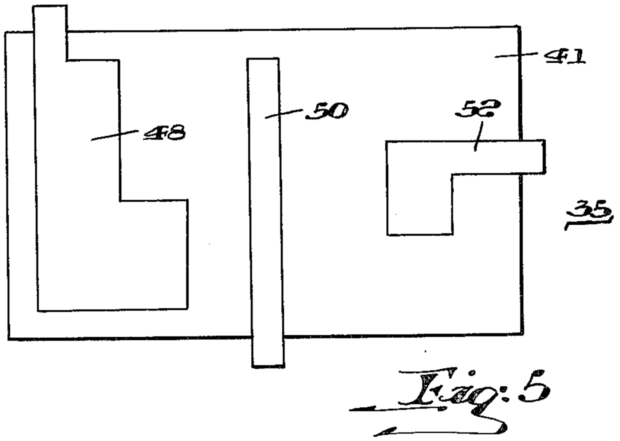
FIG. 5 is a bottom view of the wafer of semiconductor material showing the location of ohmic contacts thereon.

As shown in FIG. 5, spaced ohmic contacts 48, 50 and 52 are provided on the bottom surface 41 of the wafer 35. These contacts can be composed of the same, or similar, material to that used for emitter 42 mentioned above, since ohmic contact by these foils is to be made to the n-type semiconductor material. Preferably, these contacts are fused or alloyed with the wafer 35 in the same operation by which alloying or fusion of the emitter 42 and ohmic contacts 43, 44, 45 and 46 occurs.

It should be noted that portions of foils 43 and 44 extend over the edge of the top surface 38 of wafer 35. Similarly, portions of foil 50 and foil 52 on the bottom surface 41 extend beyond the edge. During alloying or fusion of the foils to their respective surfaces, the extension of foil 43 extending beyond the edge of top surface 38 and the portion of foil 50 beyond the edge of the bottom surface 41 flow together to form a continuous contact along the side of the wafer denoted 150 in FIG. 7. In the same fashion, the extensions of foils 44 and 52 flow together and form a continuous contact along the end of the wafer 35 and denoted 152 in FIG. 7. The use of foils of gold and a doping material for these members ensures good ohmic contact with the wafer 35, and provides a method whereby the fusion can be carried out well below the melting point of gold.

It should be understood, of course, that the fusion and alloying steps described can be carried out in a jig or other suitable apparatus to ensure that the various foils remain in position during the processing. Other suitable techniques are apparent to those skilled in the art. For example, the various conductivity region can be made by planar techniques in which diffusion is practiced to localized areas while the remainder of the body is masked. Ohmic contacts can be applied by plating, evaporation or other well known means.

Figure 6:
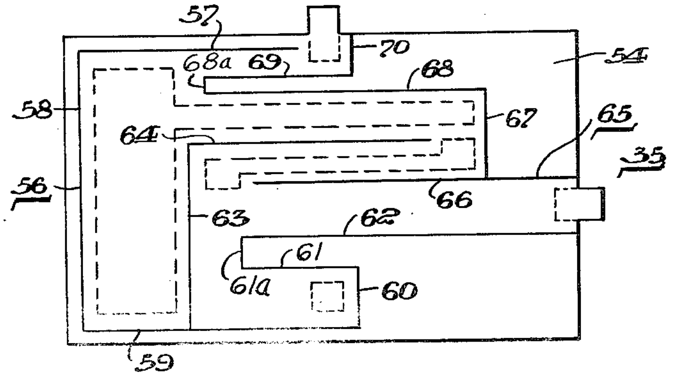
FIG. 6 is a top view of the wafer being further processed to apply grooves.

After the emitter and ohmic contacts are provided, the top surface 38 of wafer 35 is coated with an etch resisting masking material 54, for example Apiezon wax (see FIG. 6). A first line 56 comprised of segments **57, 58, 59, 60, 61, 61*a*, 62, 63 and 64 is scribed entirely through the wax as shown. A second line 65 comprised of segments 66, 67, 68, 68*a*, 69 and 70 is scribed through the wax coating 54, and extends from the end adjacent ohmic contact 44, parallel to emitter 42 then around the end of the emitter and toward ohmic contact 46 before terminating at the side of the wafer 35 adjacent contact 43. Scribing is conveniently accomplished with a sharp pointed tool or the like. The resulting scribed lines are then etched with a suitable silicon etchant, for example an etchant comprised, by volume, of 3 parts of nitric acid, 1 part hydrofluoric acid and 1 part acetic acid. The etching is continued until the scribed lines are etched entirely through the p-type region 36 into the n-type region 37 whereby grooves are provided. After the etching is terminated, the masking material 54 is removed from the top surface 38 of water 35**. Of course, means other than etching may be employed to provide the grooves. It is to be noted that the grooves, however formed, effectively determine the areas circumscribed and comprises an easy way to adjust the internal electrical characteristics.

Figures 7, 8:
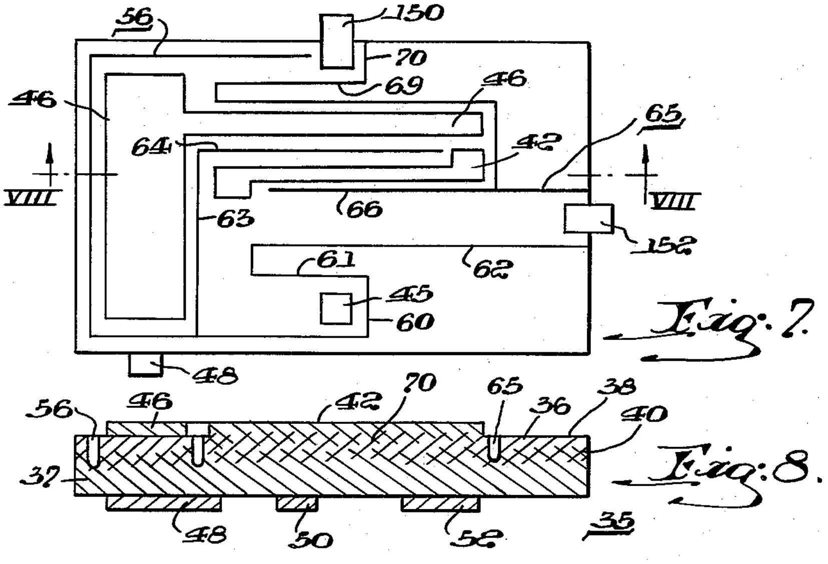
FIG. 7 is a top view of the wafer of semiconductor material being further processed.
FIG. 8 is a side view in cross-section taken along line VIII—VIII of FIG. 7.

FIG. 7 shows the top surface 38 of wafer 35 after the foregoing operations are completed and FIG. 8 is a cross-sectional view of the wafer in FIG. 7 taken along line VIII—VIII. It should be noted that the n-type emitter 42, upon alloying or fusion with the surface 38 of the wafer, provides an additional n-p junction 70 in the device at the interface of the bottom surface of the emitter 42 and the top surface 38 of wafer 35. It will also be noted that the grooves 56 and 65 cut entirely through the p-n junction 40.

Referring jointly to FIGS. 5, 6 and 7, it can be noted that segment 66 of groove 65 and segment 62 of groove 56 extend inwardly, and parallel to one another, from the end of wafer 35 at each side of contact 152. The resulting area in the top or p-layer 36 of the wafer is a resistance or conductivity path in the resulting unit. Segments 57, 58, 59, 60, 61 and **61*a* of groove 56 are largely around the periphery of the wafer, beginning adjacent contact 150 and terminating in contact with segment 62 after going around contact 46. Segment 57 of groove 56 and segment 69 of groove 65 define a zone or resistance in the p-layer 36 that extends between contacts 150 and 46. Segments 63 and 64 of groove 56 which are, respectively, parallel to and perpendicular to segment 58**, serve largely to define base areas of the transistors. Segment 63 in cooperation with segments 60 and 61, of groove 56, define or enclose another resistance p-layer 36 through which D.-C. biasing voltage is applied from foil contact 45. The n-zones between the contacts on the bottom surface 41 constitute the remaining resistances of the device. The resulting processed wafer is, as thus described, a molecularized or monolithic monostable multivibrator.

The monostable multivibrator is comprised of a pair of transistors coupled so that when a B+ and cutoff bias D.-C. voltage are first applied one transistor conducts and the other does not due to a cut-off D.-C. bias voltage. Upon application of a turn-off pulse to the input of the first or conducting transistor, it turns off for a period of time determined by the characteristics of the time delay in the circuit, $R_5C$ (see FIG. 1). When that occurs, the second transistor starts conducting but is biased off again when the first transistor again returns to the conducting state. One transistor is comprised of emitter 42 and its junction 70, and the portions of the base region p-layer 36, the collector junction 40 and the n-region 37 that are between emitter 42 and the collector ohmic contact 48. The other transistor is comprised of emitter 42 and its junction 70 and the portions of the base region p-layer 36, the collector junction 40 and the collector n-region 37 that are between emitter 42 and collector foil contact 52. The capacitor is the reverse bias p-n junction 40 between the capacitor contact foils 46 and 48 and the capacity is determined largely by the area of that portion of p-n junction 40 that lies between them. These junctions are capacitors, but are voltage dependent. The capacity can be changed for each voltage value simply by changing the size of the contacts since that changes the area of the p-n junction between them.

The invention will be described further in conjunction with the following specific example in which details are given for purposes of illustration and not by way of limitation.

*Example*

An n-type silicon wafer 250 x 500 x 7 mils having a resistivity of about 20 to 30 ohm cm. is diffused with aluminum on all sides to a depth of 0.8 mil, creating a three-zone pnp structure. This is accomplished by heating the wafer in an exacuated quartz capsule for about two hours in a furnace at about 1200° C. in an atmosphere of aluminum generated by heating a container of aluminum therein at a temperature of about 1200° C. After lapping off the resulting p-layers at the ends and bottom surface of the wafer, eight one mil thick foil contacts are placed on the top and bottom surfaces of the crystal as shown in FIGS. 4 and 5 and alloyed thereto by heating the foils in place on the wafer to 700° C. in a vacuum of $10^{-5}$ mm. Hg. One of these foil contacts (a foil comprised of 99.5 percent gold and 0.5 percent antimony) forms an emitter region 42 on the p-type layer 36 of the wafer, while the other four foils (comprised of 99 percent gold and 1 percent boron) on the top surface make ohmic contacts to the diffused aluminum layer. The three foils for the bottom surface are of an 0.5 percent antimony and 99.5 percent gold composition and make ohmic contact with the bottom surface 41 of the wafer. The top surface of the wafer is then masked with a thin layer of Apiezon wax and is scribed with lines as shown in FIG. 6 with a sharp-pointed tool. Grooves are etched into the wafer with an etchant comprised, by volume, of 3 parts nitric acid, 1 part hydrofluoric acid and 1 part acetic acid. The etching is continued until the scribed lines are etched through the p-aluminum layer 36 to the n-silicon material 37 so that shorting possibilities are avoided and to electrically define the internal characteristics. After termination of the etching, the wax is removed from the surfaces, and leads are soldered to the contacts.

Figure 9:
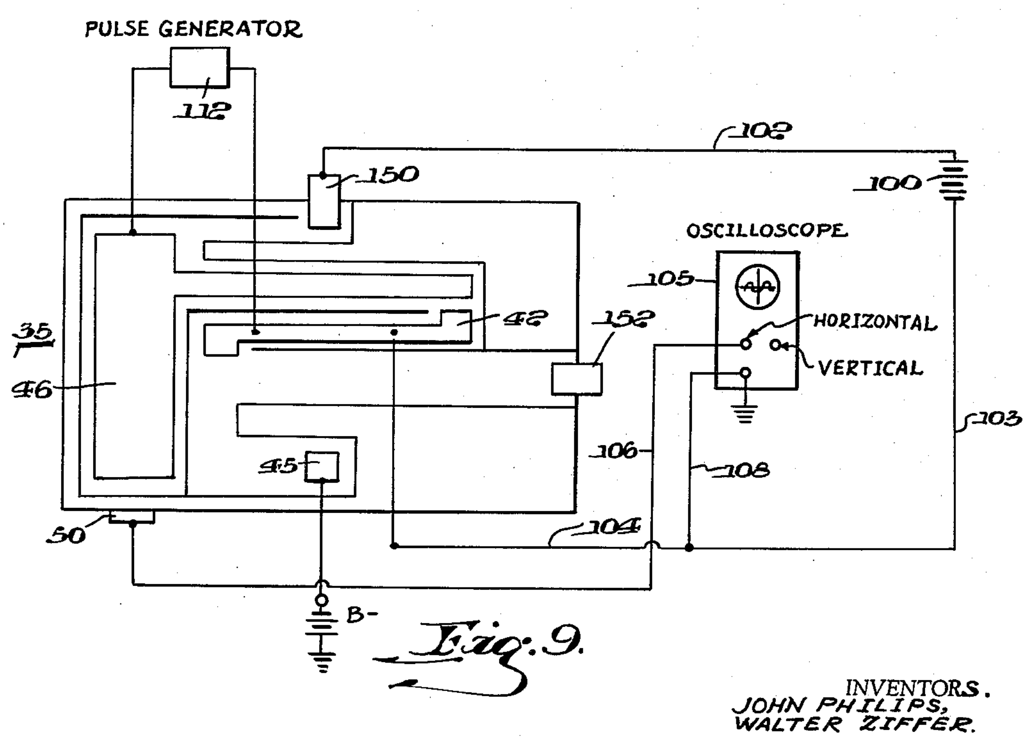
FIG. 9 is a view of the monolithic monostable multivibrator of the invention in circuit with a power source and a load.

Devices as just described have been constructed and tested in the manner indicated in FIG. 9. The positive electrode of a D.-C. power source 100 was attached by a lead 102 to the B+ ohmic contact 150. The negative terminal was attached by leads 103 and 104 to the emitter 42 on the upper surface of wafer 35. Then an oscilloscope 105 was connected to the output foil 50 and to the negative terminal of the power source 100 by leads 106 and 108 respectively. With a negative bias on contact 45, the device evidenced a steady output. Upon application of a turn-off pulse from pulse generator 112 across contact 46 and emitter 42, the output promptly decayed to a low value that remained steady for a finite period of 5 to 50 microseconds, e.g. 20 microseconds, at which time it returned to its first steady value. This is the typical square wave pulse form that is characteristic of monostable multivibrators. The stable state exists until a turn-off pulse is applied. That decays the output which is retained at its decayed value for a period that is determined by the time delay (RC) characteristic of the structure after which the output promptly returns to its original or characteristic output and remains there until another cut-off pulse is applied.

It will be appreciated that changes can be made in the present invention without departing from its scope. The specific device shown represents a structure with minimized external leads. However, by splitting the emitter 42 into two contacts corresponding to the large ends of the emitter as shown in the drawings the electrical characteristics are improved at the minor cost of an additional lead. Where two emitter contacts are used, grooves are provided between segments 64 and 66 (FIG. 7) to isolate the emitters from one another. Other changes that can be made include providing the conductivity zones by diffusion while the remainder of the device is masked. Evaporation techniques can be used to apply the contacts. The foregoing techniques usually result in a smaller device than would otherwise be produced. For similar or other purposes, more of the resistances can be built into either the top or bottom layer of the essentially two layer structure. Other changes will be suggested to the artisan upon consideration of this description.

The monolithic monostable multivibrator of the invention can be used in oscilloscopes, radar and computers for the circuits now used to perform the indicated functions.

In accordance with the provisions of the patent statutes, the invention has been described and explained with what is now believed to represent its best embodiment. However, it should be understood that the invention can be practiced otherwise than as specifically illustrated and described.

We claim as our invention:

1. A monolithic monostable multivibrator semiconductor device comprising a body of a semiconductor material, said body containing a top region of a first type of semiconductivity and a bottom region of a second type of semiconductivity, a p-n junction between the bottom surface of the top region and the top surface of the bottom region, a first, a second and a third ohmic contact disposed on the bottom surface of the bottom region, two of said ohmic contacts extending around edges of the body of semiconductor material and forming ohmic contacts with the top surface of the top region, a fourth and a fifth ohmic contact on the top surface of the top region, a region of second type of semiconductivity formed on the top surface of the top region, a p-n junction between the top surface of the top region and the bottom surface of the region of second type of semiconductivity formed on the top surface of the top region of the body of semiconductor material, a first pair of spaced grooves defining a first elongated path through the top region, the grooves extending centrally from the sides of one of the ohmic contacts on the top surface of the top region that extends around an edge of the body of semiconductor material to the bottom surface of the bottom region, a second pair of spaced grooves defining a second elongated path through the top region extending between one of the fourth and fifth ohmic contacts and the other ohmic contact on the top region that is also in ohmic contact with the bottom surface of the bottom region, a fifth groove extending along said one of the fourth and fifth ohmic contacts between that ohmic contact and the region of second type conductivity on the top surface of the top region as well as between that ohmic contact and the first elongated path through the top region, a sixth groove extending from an end of the fifth groove around the other of the fourth and fifth ohmic contacts to an internal end of one of the first pair of spaced grooves defining a third zone in the top region of the body of semiconductor material which third zone directly communicates with the first elongated zone, each of the grooves extending from the top surface of the top region through to the bottom region of the body of semiconductor material.

2. A monolithic monostable multivibrator semiconductor device comprising, within a unitary body of semiconductor material, two transistors in common emitter connection, said two transistors each comprising emitter, base and collector regions with said emitter and collector regions being of a first semiconductivity type and said base regions being of a second semiconductivity type, said emitter regions being electrically common, means to produce a time delay between said two transistors comprising a capacitance electrically between the base of a first of said two transistors and the collector of a second of said two transistors, said capacitance being provided by a p-n junction between a semiconductive region electrically common with said base and a semiconductive region electrically common with said collector, and at least a first resistance electrically connected to said base of said first transistor and a second resistance electrically between said collector of said first transistor and said base of said second transistor, said resistances being provided by portions of a semiconductive region electrically common with said base regions.

3. A device according to claim 2, the semiconductor material being silicon.

References Cited by the Examiner

UNITED STATES PATENTS

| | | | |
|---|---|---|---|
| 2,663,806 | 12/1953 | Darlington | 307—88.5 |
| 2,964,648 | 12/1960 | Douchette et al. | 317—234 |
| 2,986,649 | 5/1961 | Wray | 307—88.5 |
| 3,029,366 | 4/1962 | Lehovec | 317—234 |

OTHER REFERENCES

Electronics: Aug. 7, 1959, pages 110–111; an article, "Semiconductor Solid Circuits," by Jack S. Kilby.

JOHN W. HUCKERT, *Primary Examiner.*

JAMES D. KALLAM, *Examiner.*